United States Patent
Kozono

[11] Patent Number: 5,909,054
[45] Date of Patent: Jun. 1, 1999

[54] SEMICONDUCTOR DEVICE HAVING A MULTIPLE-TERMINAL INTEGRATED CIRCUIT FORMED ON A CIRCUIT SUBSTRATE

[75] Inventor: Hiroyuki Kozono, Omiya, Japan

[73] Assignee: Kabushiki Kaisha Toshiba, Kawasaki, Japan

[21] Appl. No.: 08/962,184

[22] Filed: Oct. 31, 1997

Related U.S. Application Data

[63] Continuation of application No. 08/636,556, Apr. 23, 1996, abandoned.

[30] Foreign Application Priority Data

May 16, 1995 [JP] Japan .................................. 7-117251

[51] Int. Cl.⁶ ..................... H01L 23/02; H01L 23/48; H01L 23/34; H01L 23/28
[52] U.S. Cl. .................... 257/667; 257/737; 257/738; 257/774; 257/693; 257/795
[58] Field of Search ........................ 257/690, 737, 257/738, 735, 692, 693, 698, 703, 774, 780, 695, 786, 787, 790, 795, 734, 667

[56] References Cited

U.S. PATENT DOCUMENTS

| | | |
|---|---|---|
| 4,965,653 | 10/1990 | Otsuka et al. ............................ 257/750 |
| 5,218,234 | 6/1993 | Thompson et al. ....................... 257/738 |
| 5,291,062 | 3/1994 | Higgins, III .............................. 257/693 |
| 5,334,857 | 8/1994 | Mennitt et al. .......................... 257/737 |
| 5,355,283 | 10/1994 | Marrs et al. ............................. 257/687 |
| 5,433,822 | 7/1995 | Mimura et al. .......................... 257/737 |
| 5,468,999 | 11/1995 | Lin et al. ................................. 257/738 |
| 5,497,032 | 3/1996 | Tsuji et al. ............................... 257/692 |
| 5,552,635 | 9/1996 | Kim et al. ................................ 257/706 |
| 5,581,122 | 12/1996 | Chao et al. .............................. 257/738 |
| 5,598,036 | 1/1997 | Ho ............................................ 257/738 |
| 5,604,379 | 2/1997 | Mori ......................................... 257/738 |
| 5,640,047 | 6/1997 | Nakashima .............................. 257/698 |
| 5,717,252 | 2/1998 | Nakashima et al. .................... 257/738 |
| 5,731,630 | 3/1998 | Suyama et al. .......................... 257/737 |

*Primary Examiner*—Alexander Oscar Williams
*Attorney, Agent, or Firm*—Finnegan, Henderson, Farabow, Garrett & Dunner, L.L.P.

[57] ABSTRACT

A semiconductor device comprises a multiple-terminal integrated circuit formed on a substrate. The integrated circuit is formed on the upper surface of the substrate and electrically connected to a plurality of external terminals arranged on an under surface of the substrate. Part of a sealing member is embedded in a plurality of through-holes. The through holes are provided in the substrate to be in the vicinity of the plurality of external terminals. The sealing member seals the upper surface of the substrate, with the integrated circuit formed thereon.

6 Claims, 5 Drawing Sheets

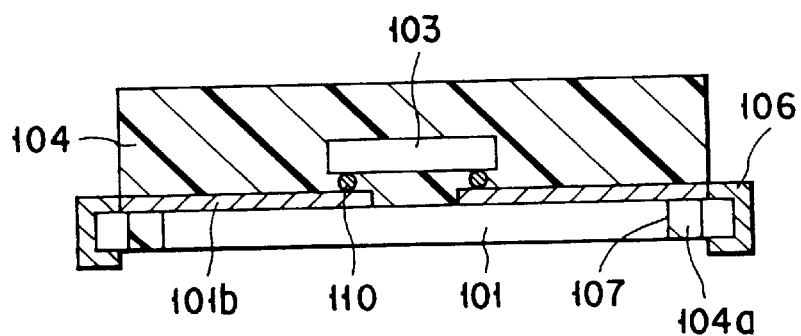
F I G. 12

SEMICONDUCTOR DEVICE HAVING A MULTIPLE-TERMINAL INTEGRATED CIRCUIT FORMED ON A CIRCUIT SUBSTRATE

This application is a continuation, of application Ser. No. 08/636,556, filed Apr. 23, 1996, now abandoned.

BACKGROUND OF THE INVENTION

1. Field of the Invention

The present invention relates to a semiconductor device used as a one-sided package device, wherein a multiple-terminal integrated circuit is formed on a circuit substrate, and only one side on which the integrated circuit is formed is sealed by resin.

2. Description of the Related Art

Hitherto, there have been developed one-sided package devices wherein an integrated circuit with not less than 200 terminals is formed on a glass epoxy substrate. The circuit is provided on only one side of the substrate, and that side is sealed by resin. These devices can be manufactured at low cost and easily mounted on a mounting substrate.

The conventional one-sided package semiconductor device will now be explained with reference to the plan view of FIG. 1, the under surface view of FIG. 2 and a sectional view taken along III—III line of FIG. 1.

An integrated circuit 3 with many terminals is adhered to an element portion 1a of a glass epoxy resin substrate 1 with paste 2 such as adhesive agent or solder. One side of the substrate, on which the integrated circuit 3 is formed, is sealed by resin 4.

A plurality of electrode pads 3a are provided on the periphery of the integrated circuit 3. The pads 3a are connected to a plurality of conductive paths 1b by metal wires 5, respectively. The element portion 1a surrounds the periphery of the integrated circuit 3 provided on the upper surface of the glass epoxy substrate 1.

The conductive paths 1b are connected to external terminals 6. The terminals 6 are arranged over the periphery and sides of the upper surface of the glass epoxy substrate 1 and the under surface thereof.

For simplicity, an integrated circuit having only a few terminals is exemplified here.

Since a one-sided package device of the above structure requires only a small amount of resin 4 for sealing, it can be manufactured at low cost. As can be seen from FIG. 4, the one-sided package device of this type can be easily mounted on a mounting substrate by means of surface-to-surface mounting. More specifically, it can be manufactured by connecting the external terminals 6 provided on the under surface of the glass epoxy substrate 1 to the conductive paths 11a provided on the mounting substrate 11 by the solder 12. However, this method results in the following disadvantages.

When a one-sided package device is mounted on a mounting substrate 11, heat is usually applied. Here, asymmetry of the one-sided package device causes a difference in heat conduction, often resulting in connection defects 12a of solder 12.

Specifically, the glass epoxy substrate 1 and the resin 4 differ in heat conduction, and the temperature of the substrate 1 increases more slowly than that of the resin 4. Due to this, the temperature difference between them occurs during the mounting of the device.

Consequently, if the temperature of the external terminals 6 does not increase sufficiently, solder-using connections will become unstable.

Additionally, another conventional one-sided package device wherein bump electrodes 7 are provided on the under surface of the glass epoxy substrate 1 to serve as external terminals, is shown in the plan view of FIG. 5, the under surface view of FIG. 6 and the sectional view of FIG. 7 taken along VII—VII line of FIG. 5. The one-sided package device of this type has similar disadvantages to those mentioned before.

Namely, as shown in FIG. 8, in the one-sided package device having the bump electrodes 7 used as external terminals, when the bump electrodes 7 are connected to the conductive paths 11a on the mounting substrate 11 by bump-like solder 13, there often occurs connection defects such as an unconnected portion 13a or a short-circuited portion 13b. Besides, there is a possibility of water ingress to the interface between the sealing member and the substrate.

SUMMARY OF THE INVENTION

The present invention has been made under the circumstances mentioned above. Its object is to provide a semiconductor device in which the connection between the external terminals and the conductive paths remains intact while the semiconductor device is being mounted on a mounting substrate, and water ingress to the interface between the sealing member and the circuit substrate is prevented, and which can therefore remain very reliable.

To attain this object, there is provided a semiconductor device having a multiple-terminal integrated circuit formed on a substrate, comprising:

a substrate having a plurality of through holes;

an integrated circuit provided on an upper surface of the substrate;

a plurality of external terminals to which the integrated circuit is electrically connected and which are arranged on an under surface of the substrate; and a sealing member, provided near the external terminals and partly embedded in the through holes, sealing the upper surface of the substrate.

BRIEF DESCRIPTION OF THE DRAWINGS

FIG. 12 is a sectional view of essential parts of a semiconductor device according to another embodiment of the present invention;

DETAILED DESCRIPTION OF THE PREFERRED EMBODIMENTS

Explanation will now be given to the first embodiment of the semiconductor device wherein a multiple-terminal integrated circuit is formed on a circuit substrate according to the present invention, while referring to drawings.

Figure 1:
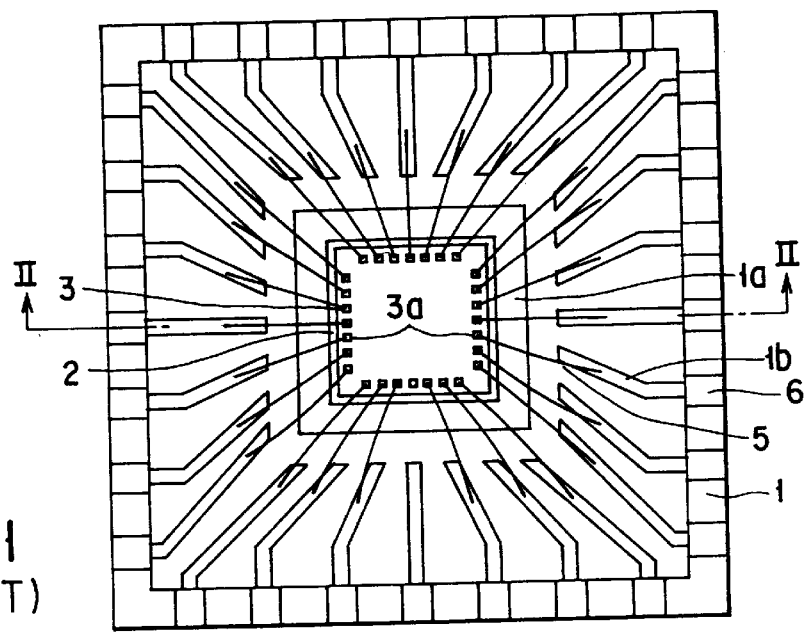
FIG. 1 is a plan view of a conventional one-sided package semiconductor device having a multiple-terminal integrated circuit formed on a circuit substrate, where resin sealing agent is not shown.
Figure 2:
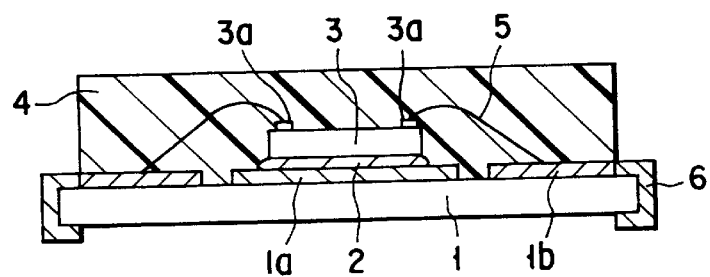
FIG. 2 is a sectional view taken along II—II line of FIG. 1.
Figure 3:
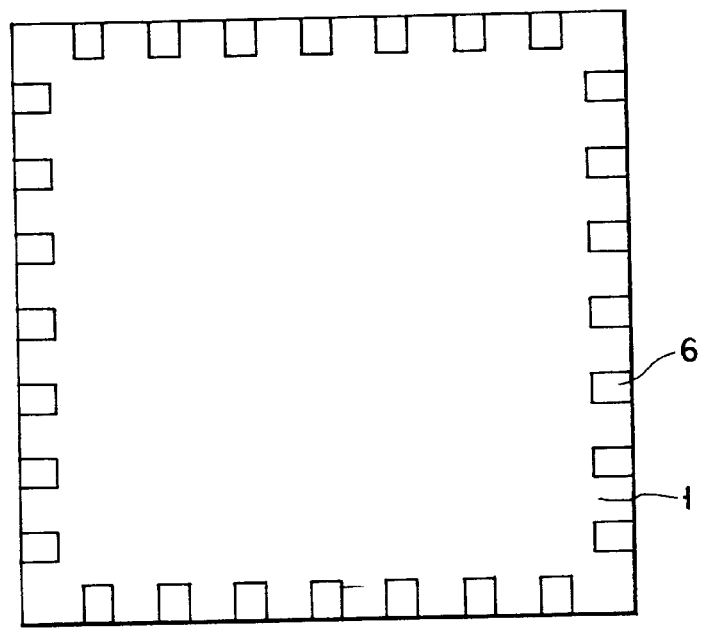
FIG. 3 is an under surface view of the semiconductor device of FIG. 1.
Figure 4:
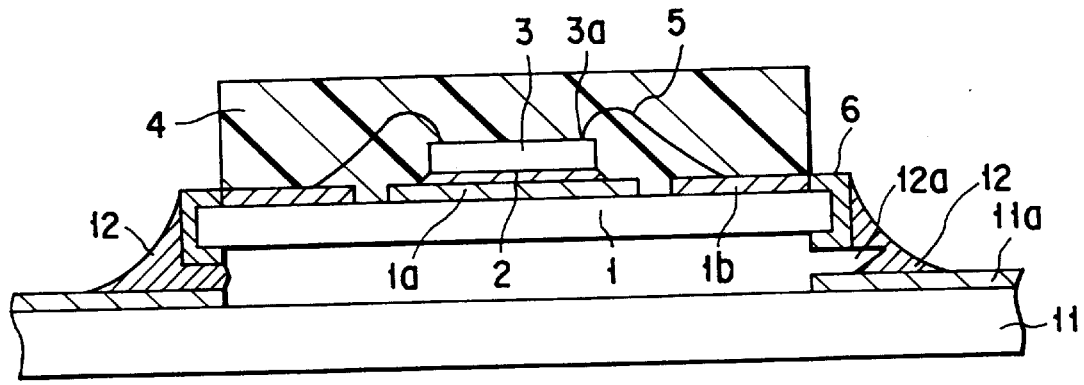
FIG. 4 is a sectional view of the conventional one-sided package semiconductor device having a multiple-terminal integrated circuit formed on a circuit substrate, where disadvantages thereof are illustrated.
Figure 8:
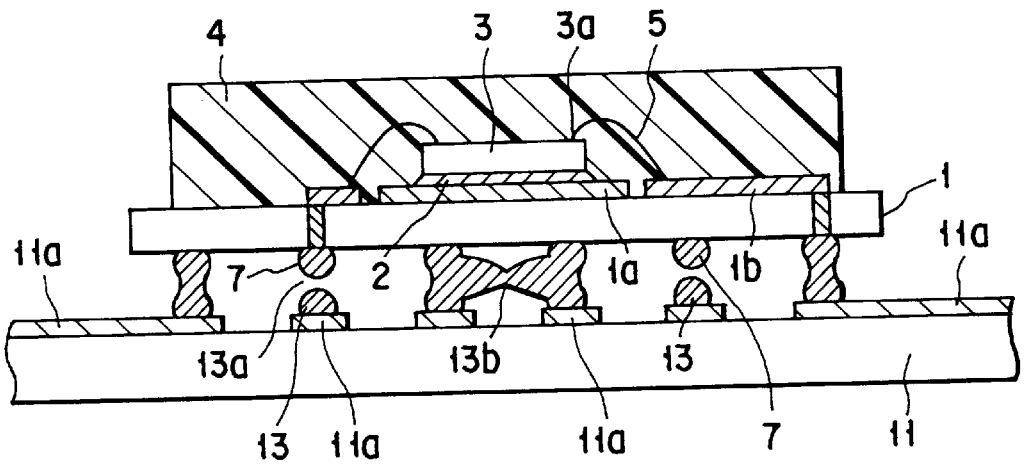
FIG. 8 is a sectional view of the semiconductor device of FIG. 7, where disadvantages thereof are illustrated.
Figure 5:
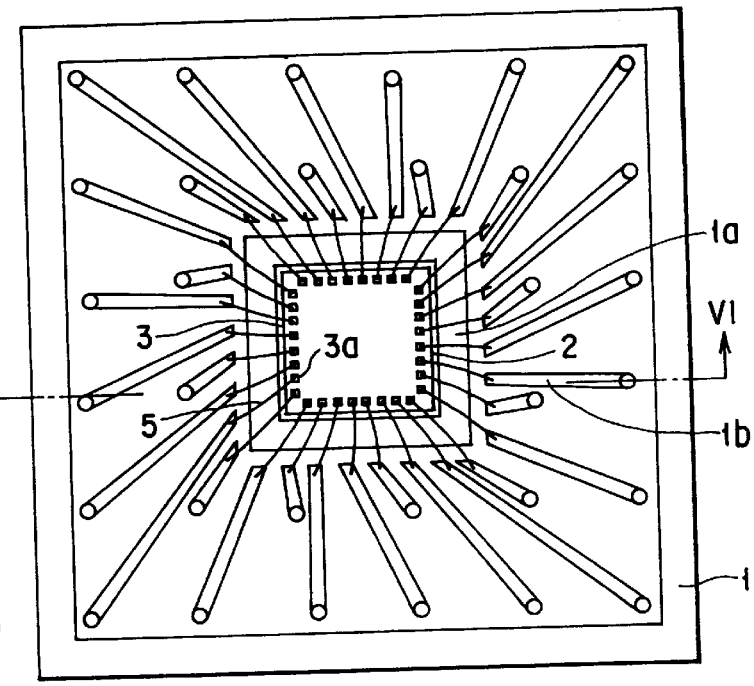
FIG. 5 is a plan view of another conventional one-sided package semiconductor device having a multiple-terminal integrated circuit formed on a circuit substrate, where resin sealing agent is not shown.
Figure 6:
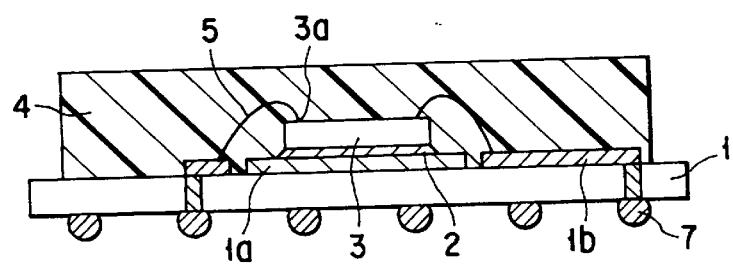
FIG. 6 is a sectional view taken along a VI—VI line of FIG. 5.
Figure 7:
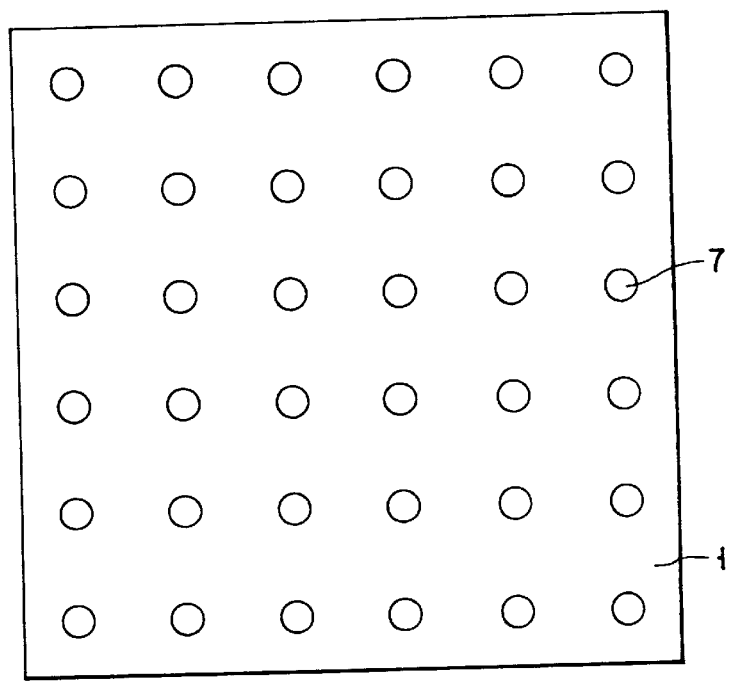
FIG. 7 is an under surface view of the semiconductor device of FIG. 6.
Figure 9:
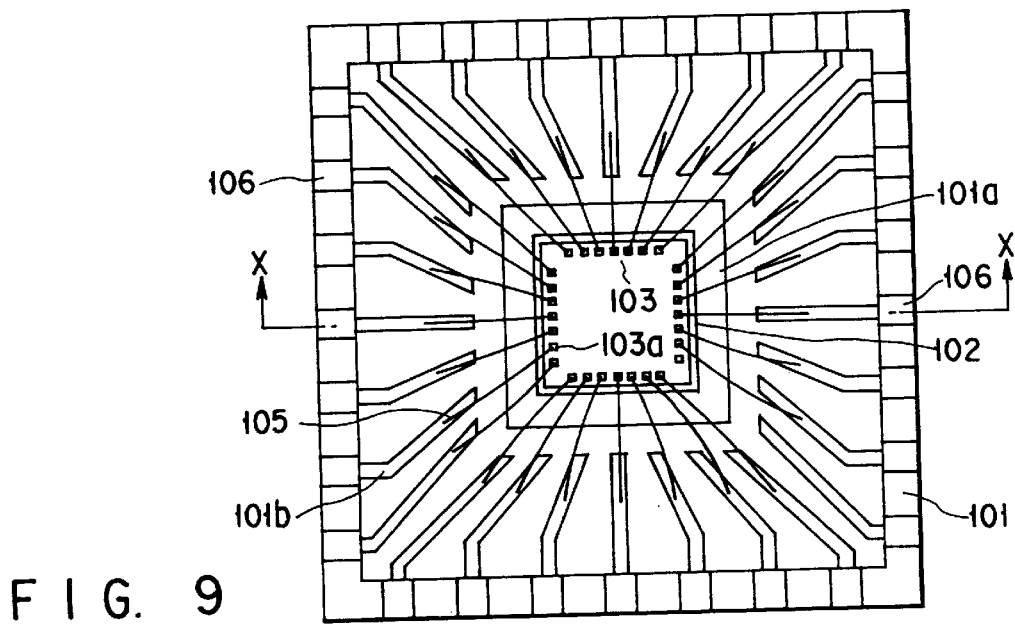
FIG. 9 is a plan view of a one-sided package semiconductor device according to a first embodiment of the present invention having a multiple-terminal integrated circuit formed on a circuit substrate, where resin sealing agent is not shown.
Figure 10:
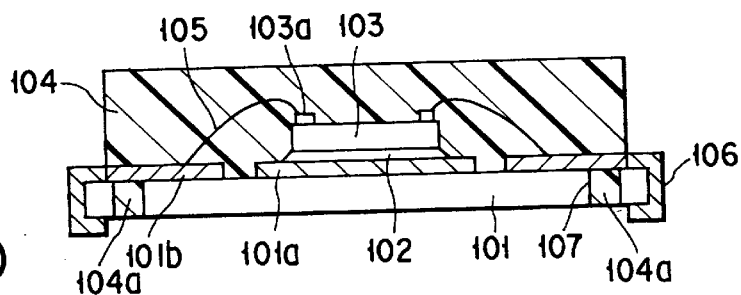
FIG. 10 is a sectional view taken along X—X line of FIG. 9.
Figure 11:
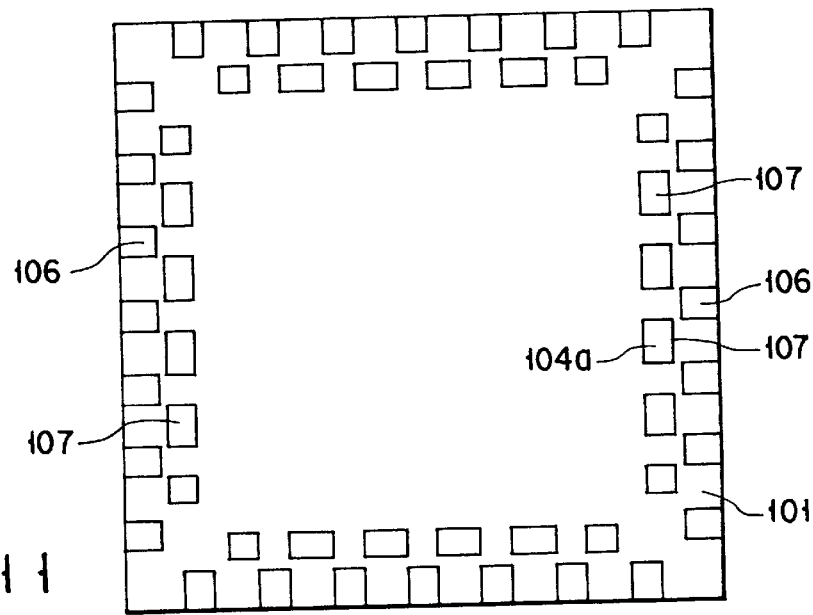
FIG. 11 is an under surface view of the semiconductor device of FIG. 9.

FIGS. 9 to 11 illustrate the first embodiment of the present invention. FIG. 9 is a plan view of the one-sided package semiconductor device having a multiple-terminal integrated circuit formed on a circuit substrate, where a resin sealing agent is not shown.

The one-sided package device is constructed such that an integrated circuit 103 is adhered to the element portion 101a of a glass epoxy substrate 101 with paste 102 such as adhesive agent or solder, and that the side on which the circuit 103 is formed, is sealed by resin 104.

A plurality of conductive paths 101b are arranged on the upper surface of the glass epoxy substrate 101 to surround the element portion 101a.

Electrode pads 103a are provided on the upper surface of the integrated circuit 103. The pads 103a are connected to the conductive paths 101b via metal wires 105, respectively.

As shown in FIG. 11, a plurality of external terminals 106 are arranged over the periphery and sides of the upper surface of the glass epoxy substrate 101, and the periphery of the under surface thereof.

The conductive paths 101b are connected to the external terminals 106, respectively.

Also, a plurality of through holes 107 are formed in the substrate 101 to be in the vicinity of the external terminals 106, respectively. The resin 104 is partly embedded in the through holes 107 to serve as embedded resin 104a. A plurality of pieces of embedded resin 104a are arranged in such a way to be inside the external terminals 106 provided on the outer periphery of the upper surface of the substrate 101, and to be surrounded by the terminals 106. With this structure, the sealing resin 104 is higher in heat conduction than the glass epoxy which is material for the substrate 101. Due to this, even if heat is applied while mounting is going on, the high temperature of the embedded resin 104a is transmitted to the substrate 101 with lower heat conduction in the through holes 107. This can lessen the temperature difference between the resin 104 and the substrate 101. As a result, while mounting is going on, the temperature of the external terminals 106 can be increased by the temperature transmitted from the resin 104, and connection using the solder 12 is thereby stabilized.

Furthermore, due to the fact that the sealing resin 104 is embedded in the through holes 107 in the glass epoxy substrate 101, adhesion between the glass epoxy substrate 101 and the resin 104 at the interface is enhanced to thereby improve moisture resistance characteristics of the device. As mentioned above, the through holes are provided in the vicinity of the external terminals of the glass epoxy substrate and the sealing resin is partly embedded in the holes. As the temperature increases in the embedded resin, the high temperature is transmitted to the external terminals, thus lessening the temperature difference between the embedded resin and the external terminals. Therefore, even if heat is applied while the one-sided package device is mounted on the mounting substrate, it is possible to prevent connection defects between the external terminals of the one-sided package device and the conductive paths on the mounting substrate, and to realize stable, reliable connections.

Moreover, since adhesion between the glass epoxy substrate and the resin at the interface is enhanced, the one-sided package semiconductor device can have improved moisture resistance characteristics and therefore high reliability. The connection between the external terminals of the glass epoxy resin and the conductive paths is, meanwhile, quite effective in that different temperatures can be rendered equal since sizes or positions of the pieces of the embedded resin can be determined experimentally or experientially.

In the above embodiment, explanation has been given to the one-sided package device wherein the conductive paths on the glass epoxy substrate are connected with the electrode pads on the integrated circuit via the metal wires, respectively. However, the present invention is not restricted to this embodiment alone. As shown in, for example, FIG. 12, the one-sided package device can be constructed such that the conductive paths 101b on the glass epoxy substrate 101 are connected with the integrated circuit 103 via bump electrodes 110.

Additionally, the present invention is not restricted to a case of mounting an integrated circuit on a mounting substrate using lead-like external terminals 106 arranged on the sides of the glass epoxy substrate 101. The one-sided package device can be provided with bump-like external terminals instead of the lead-like terminals for mounting the device on the mounting substrate.

Figures 13, 14, 15:
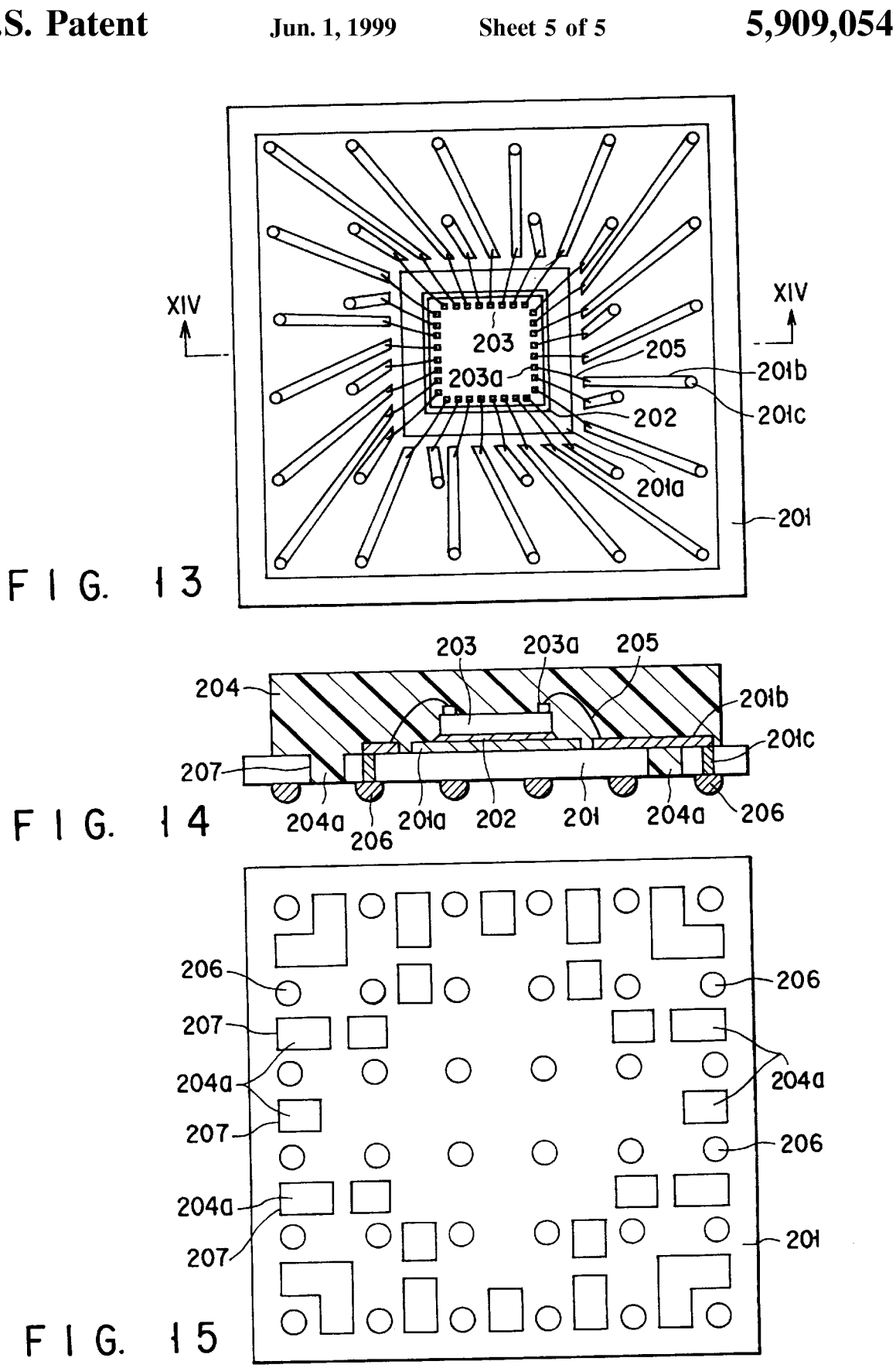
FIG. 13 is a plan view of a one-sided package semiconductor device wherein a multiple-terminal integrated circuit is formed on a circuit substrate, where resin sealing agent is not shown.
FIG. 14 is a sectional view taken along XIV—XIV line of FIG. 13.
FIG. 15 is an under surface view of the semiconductor device of FIG. 13.

FIG. 13 is a plan view of the one-sided package semiconductor device wherein a multiple-terminal integrated circuit is formed on a circuit substrate, where a resin sealing agent is not shown according to another embodiment of the present invention. As shown in FIGS. 14 and 15, the integrated circuit is formed on a substrate 201 provided with bump-like external terminals 206. The one-sided package device is mounted on a mounting substrate using the external terminals 206.

A plurality of bump-like external terminals 206 are provided on the under surface of the glass epoxy substrate 201.

Conductive paths 201b on the glass epoxy substrate 201 are connected to the external terminals 206 via through holes 201c, respectively.

Electrode pads 203a on the integrated circuit 203 are connected to the conductive paths 201b via metal wires 205, respectively.

The integrated circuit 203 is fixedly provided on the element portion 201a of the glass epoxy substrate 201 by paste 202.

The upper surface of the glass epoxy substrate 201, on which the integrated circuit 203 is mounted, is sealed by resin 204.

The resin 204 is partly embedded in the through-holes 207 provided in the vicinity of the external terminals 206 to serve as embedded resin 204a.

In this embodiment, a plurality of pieces of embedded resin 204a are arranged in such a way to put the individual external terminals between them.

The pieces of embedded resin 204a are provided more densely on the center of the glass epoxy substrate 201 than the periphery thereof.

With the above-mentioned structure, if the one-sided package device is mounted on the mounting substrate using the bump-like external terminals 206, the stable and reliable connection between the external terminals and the conductive paths on the mounting substrate can be ensured without connection defects.

Also, since the adhesion between the glass epoxy substrate and the resin at the interface is enhanced, the one-sided package device can have improved moisture resistance characteristics and therefore high reliability. As in the case of the first embodiment, it is possible to use bump-like electrodes 110 for connecting the conductive paths 201b provided on the glass epoxy substrate 201 with the integrated circuit 203 as shown in the embodiment of FIG. 12. Furthermore, the embodiments of the present invention illustrate a case of the one-sided package device wherein an integrated circuit having a smaller number of terminals is formed on a substrate as a matter of convenience. However, the one-sided package device can be readily constituted such that an integrated circuit with not less than 200 terminals is formed on a circuit substrate.

Besides, the present invention is not restricted to a case of the one-sided package device having one integrated circuit formed on a substrate. It can be also applied to a multi-chip module constituted by forming a plurality of integrated circuits on one circuit substrate.

Moreover, not only a glass epoxy substrate but also a ceramic substrate can be employed as a circuit substrate.

Needless to say, the present invention can be modified to such an extent that the subject matter thereof is not deviated.

What is claimed is:

1. A semiconductor device having multiple-terminal integrated circuit formed on a substrate, comprising:

a substrate having a plurality of non-electrically conductive through holes;

an integrated circuit provided on an upper surface of said substrate;

a plurality of external terminals to which said integrated circuit is electrically connected and which are arranged on an under surface of said substrate; and a sealing member, provided near the external terminals, sealing the upper surface of the substrate and having a part embedded in said through holes, the sealing member being higher in heat conduction than the substrate to thereby conduct a portion of the heat of the sealing member to the substrate from the part of the sealing member embedded in the through holes and lessen a temperature difference between the substrate and the sealing member.

2. A semiconductor device according to claim 1, wherein said substrate is a glass epoxy substrate.

3. A semiconductor device according to claim 1, wherein said plurality of external terminals are arranged on a periphery of the upper surface of said substrate.

4. A semiconductor device according to claim 1, wherein said plurality of through holes in which part of said sealing member is embedded, are arranged to be inside said plurality of external terminals provided on an outer periphery of the upper surface of said substrate, and to be surrounded by the plurality of external terminals.

5. A semiconductor device according to claim 1, wherein said plurality of through holes in which part of said sealing member is embedded, are arranged more densely at a periphery of said substrate than a center portion of said substrate.

6. A semiconductor device according to claim 1, wherein said external terminals are bump-shaped terminals.

* * * * *